United States Patent [19]

Eales et al.

[11] Patent Number: 4,615,031

[45] Date of Patent: Sep. 30, 1986

[54] INJECTION LASER PACKAGES

[75] Inventors: Brian A. Eales, Stansted; Terry Bricheno, Great Sampford; Norman D. Leggett, Hoddesdon; John E. U. Ashton, Galmpton, all of England

[73] Assignee: International Standard Electric Corporation, New York, N.Y.

[21] Appl. No.: 514,066

[22] Filed: Jul. 15, 1983

[30] Foreign Application Priority Data

Jul. 27, 1982 [GB] United Kingdom ............... 8221649

[51] Int. Cl.⁴ .............................................. H01S 3/045
[52] U.S. Cl. ................................. 372/36; 350/96.2; 357/81
[58] Field of Search ................ 372/36; 350/96.2; 357/81, 87, 74, 17

[56] References Cited

U.S. PATENT DOCUMENTS

| | | | |
|---|---|---|---|
| 3,449,173 | 6/1969 | Rupprecht et al. | 357/87 |
| 4,351,051 | 9/1982 | van Alem et al. | 372/36 |
| 4,399,541 | 8/1983 | Kavats et al. | 372/36 |

FOREIGN PATENT DOCUMENTS 0148483  11/1980  Japan ........................... 372/36

OTHER PUBLICATIONS

R. Simmons et al, "Electrical-to-Optical Contact Modification", *IBM Technical Disclosure Bulletin*, vol. 17, No. 8, Jan. 1975, p. 2372.

*Primary Examiner*—James W. Davie
*Attorney, Agent, or Firm*—John T. O'Halloran; Mary C. Werner

[57] ABSTRACT

A hermetically sealed injection laser package is made by first forming a sub-assembly of a monitoring photodiode (50) on a metal support member (53) and welding it to a heat sink (30) on which the laser (31) is mounted. The heat sink is secured inside the package housing (10) and then a further sub-assembly, comprising a plastics packaged optical fiber (60) hermetically sealed in a fiber support tube (61), is introduced through an aperture in one wall of the housing. Anchorage means (70) is laser beam welded to this tube and to the heat sink to secure the inner end in position for optimum optical coupling between the laser and the fiber.

10 Claims, 11 Drawing Figures

INJECTION LASER PACKAGES

BACKGROUND OF THE INVENTION

This invention relates to the manufacture of injection laser packages, and in particular to the manufacture of hermetically sealed injection laser packages with glass optical fiber tails especially, though not exclusively, for use in submarine telecommunications cable. For submarine telecommunications use the fiber will normally be single mode fiber, and single mode fiber will also be the preferred option for many landline applications.

An important characteristic for any component destined for submarine use in a telecommunications cable is that it shall operate reliably without need for servicing for a period typically exceeding 25 years. In the context of the present device, this means that a construction is required which will provide long term hermeticity of the package and stability of the position of the inner end of the optical fiber tail with respect to the laser.

SUMMARY OF THE INVENTION

According to the present invention there is provided a method of making a hermetically sealed injection laser package with a plastics packaged glass optical fiber tail, in which hermeticity of the package is afforded by the use of glass-to-metal and metal-to-metal seals rather than resin seals, wherein the injection laser is mounted in a metal package housing directly or indirectly on a metal heat sink secured inside the package housing, wherein the optical fiber tail is hermetically sealed with a hermetic glass-to-metal joint in a metal support tube which is itself hermetically sealed with a metal-to-metal seal through one wall of the housing, which method includes the step of securing the laser in position within the housing, and the step of inserting the support tube, with the fiber tail sealed therein, through an aperture in the housing wall to protrude freely inside the housing and, either before or after making said metal-to-metal hermetic seal between the support tube and the wall of the housing, the steps of siting anchorage means on the heat sink to embrace the support tube and adjusting the position of the tube with respect to the heat sink for optimum optical coupling of the laser output with the optical fiber tail, and, while that position is maintained, of securing by laser beam welding the anchorage means to the heat sink and to the support tube or to a member rigidly secured to the support tube.

It is found that the avoidance of resins, such as epoxy resins, in the provision of hermetic seals in favour of glass-to-metal and metal-to-metal seals can provide adequate long term hermeticity. Further the use of laser welding to position the optical fiber end relative to the laser provides a fixing method in which there can be minimal relaxation, and hence relative movement, of the components during the fixing and subsequent to it. Preferably the anchorage means by which the fiber tail tube is fixed to the heat sink is made of a material having a coefficient of thermal expansion substantially matched with that of the diamond pedestal so as to minimize thermally induced displacement of the optical fiber axis with respect to the laser axis.

Optionally the light power output of the laser can be monitored using a photodiode to detect the power output from the laser end facet remote from the fiber tail. If such a photodetector is used it is advantageous to angle its front surface so that any light from the laser striking this surface, but not being absorbed, is reflected off the laser axis so as to avoid the creation of a subsidiary optical cavity. Reflection at the inner end of the fiber tail can similarly produce unwanted coupled cavity effects upon the operation of the laser. The incidence of such perturbations can be reduced by having a convex lens-shaped end, rather than a plane one, at the inner end of the optical fiber tail.

BRIEF DESCRIPTION OF THE DRAWING

There follows a description of laser packages embodying the invention in preferred forms. Both packages incorporate a monitoring photodiode. The description refers to the accompanying drawings in which.

The laser package of FIGS. 1 to 9 of the drawings consists essentially of four constituents, a housing assembly, a laser submount assembly, a fiber tail assembly, and a monitor photodetector assembly.

DETAILED DESCRIPTION OF THE PREFERRED EMBODIMENT

Figure 1:
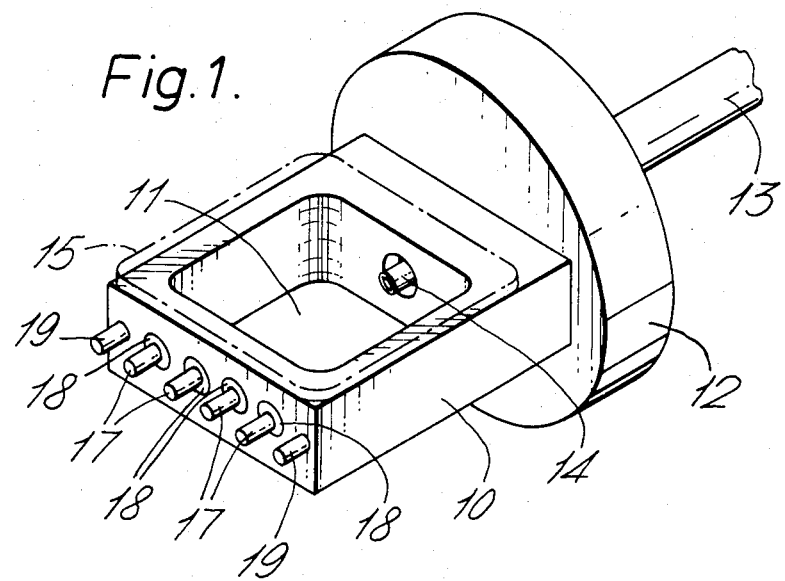
FIG. 1 is a perspective view of the housing assembly of a laser package before the fitting of the fiber tail, laser submount, and monitoring photodiode assemblies.
Figure 2:
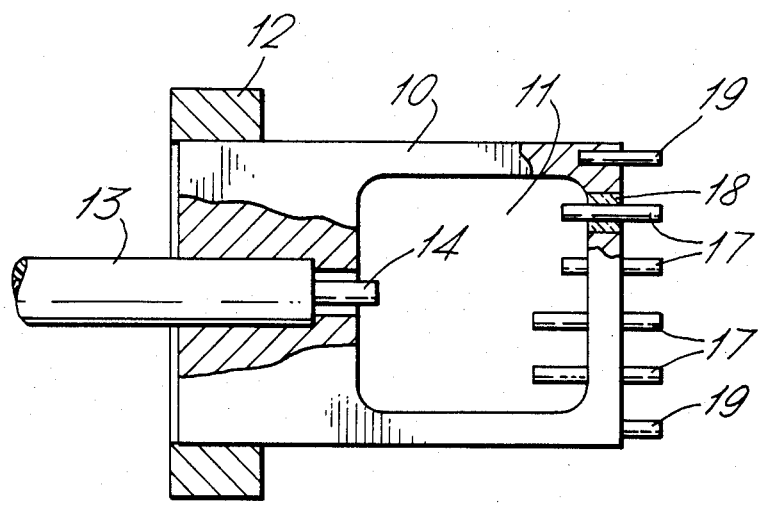
FIG. 2 is a part-sectioned plan view of the housing depicted in FIG. 1.

Referring to FIGS. 1 and 2, the housing assembly consists of a metal block 10 with a well 11 for accommodating the laser submount and monitor photodiode assemblies, a disc-shaped back-plate 12, an optical fiber feed-through tube 13 whose inner end 14 protrudes into the well 11, and a lid 15 (shown in broken outline). The feed-through tube 13 is hermetically sealed to the block 10 by a brazed metal-to-metal seal. A set of four terminal pins 17 are secured through one wall of the block in glass-to-metal seals 18. Two further terminal pins 19 make direct electrical connection with the block 10 and do not penetrate into the well 11. The lid 15 is provided with a rib (not shown) extending round the perimeter of its underside for projection welding to the block 10.

The back plate 12 is an optional feature which is employed in a package destined for a submarine application in which the disc forms part of a seal. For other applications, particularly land applications, in which it is desired to mount the package flat upon the surface of a printed circuit board or the like, the disc is omitted. In these circumstances the package may be bolted to the board with the shanks of the bolts passing through holes (not shown) machined in the block in the region that would otherwise have been covered by the disc.

Figure 3:
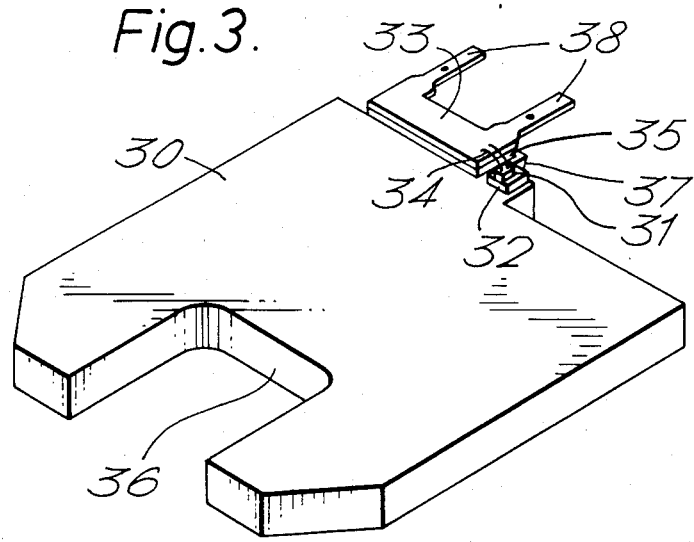
FIG. 3 is a perspective view of the laser submount assembly of the package of FIG. 1.
Figure 4:
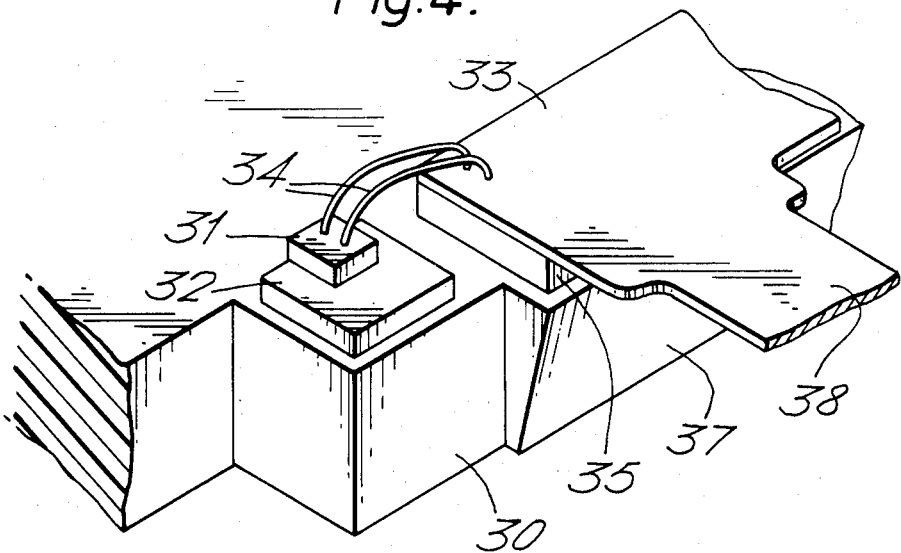
FIG. 4 is an enlarged view from a different perspective of part of the assembly of FIG. 3.

Referring to FIGS. 3 and 4, the laser submount assembly consists essentially of a heat sink 30, typically of copper or of nickel, an (Ga,In)(As,P) injection laser 31 mounted on a fully metallised diamond pedestal 32 secured to the heat sink, and a metal lead frame 33 for making electrical connection with the top of the laser by means of wire bonds 34. The lead frame is secured to the heat sink via the intermediary of an electrically insulating alumina stand-off 35.

Conveniently both major surfaces of the alumina stand-off are metallised and secured respectively to the lead frame 33 and to the heat sink 30 by brazing. Next the metalised diamond pedestal 32 is secured to the heat sink using a gold germanium solder before securing the laser to the pedestal with a lower temperature gold tin solder. Then the top connection to the laser is made by a conventional pulse tip thermal compression ball bond wire bonding technique.

A recess 36 is provided at the front end of the heat sink 30 to accommodate the inner end 14 of the feed-through tube 13 of the housing assembly, and to provide room for the sealing of the fiber tail assembly to this tube. The face 37 at the other end of the heat sink 30 is machined at an acute angle to the top of the heat sink to provide an angled surface on which to mount the photodiode assembly. Typically this angle is about 70°. The contact strip 33 has a pair of tongues 38 for welding to the inner ends of two of the terminal pins 17 (FIGS. 1 and 2) of the housing assembly.

Figure 5:
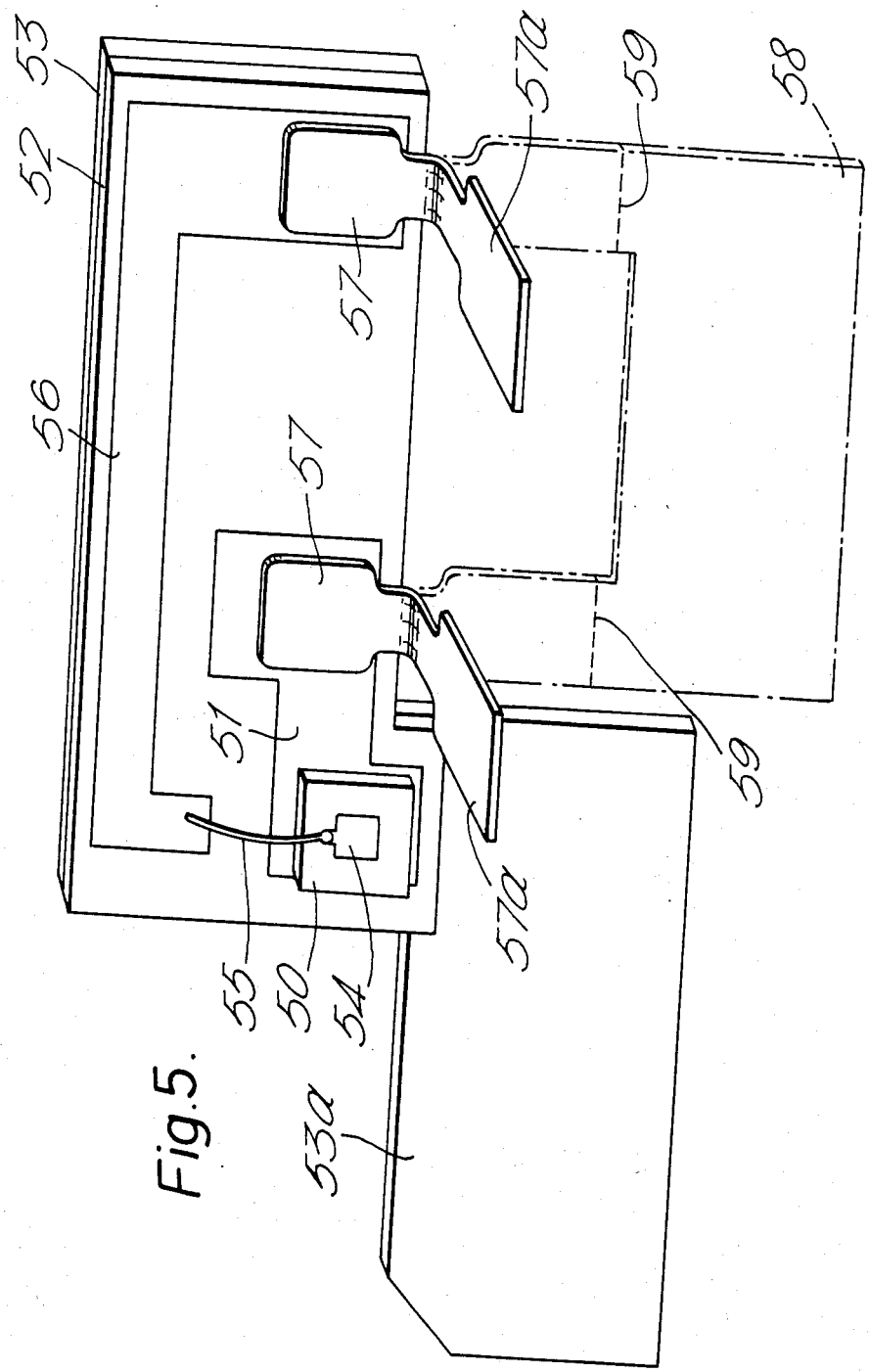
FIG. 5 is a perspective view of the monitor photodiode assembly of the package of FIG. 1.

Referring to FIG. 5, the monitor photodiode assembly consists essentially of a p-i-n photodiode 50 mounted on one track 51 of a printed circuit ceramic 52 which is itself mounted on a cranked submount 53 made of metal. For operation at 1.3 microns this photodiode may be an InGaAs/GaAs diode, for operation at 1.55 microns it may be an InGaAs/InP diode. The active area 54 of the photodiode is connected by a wire bond 55 with a second track 56 on the ceramic. Connection between these two tracks 51 and 56 and the other two pins 17 (FIGS. 1 and 2) of the housing assembly are made by way of tags 57. Initially these two tags 57 form an integral part of a single tag unit 58.

It is found convenient to use a printed circuit ceramic with a fully metallised rear surface and, using gold germanium solder, to secure the ceramic 52 to the submount 53 and the two tags 57 to their respective tracks 51 and 56 in a single soldering operation. Then the tag unit 58 is bent so that, once the assembly is in position in the housing, the lower ends 57a of the tags 57 extend along the tops of the two terminal pins 17 (FIGS. 1 and 2) to which they will later be attached. After the bending of the tag unit, the tags themselves are separated from it by cropping the unit along the line 59. Finally, a lower temperature gold tin solder can be used to secure the photodiode 50 to track 51 before wire bonding the top connection of the photodiode to track 56. At this stage the monitor photodiode assembly is ready for securing to the laser submount assembly by laser beam welding the end 53a of the cranked submount not covered by the ceramic to the angled surface 37 (FIGS. 3 and 4) of the laser submount assembly.

The correct alignment of these two assemblies serves to position the active area of the photodiode on the optic axis of the laser so that it receives the laser output emerging from its rear facet. The angled surface 37 ensures that the normal to the surface of the photodiode active area is set at an angle to the laser optic axis, and this means that any light from the laser reflected at this surface is reflected away from the laser axis and so does not contribute an unwanted positive feedback signal adversely affecting the operation of the laser.

The combined laser and photodiode assembly is then ready for mounting in the housing assembly. This is conveniently effected using a tin lead solder preform placed in the well 11 (FIGS. 1 and 2) to solder the heat sink 30 to the base of the well 11. Laser beam welding can then be used to secure the tongues 38 (FIG. 3) and the tags 57 (FIG. 5) to their respective pins 17 (FIG. 1).

Figure 6:
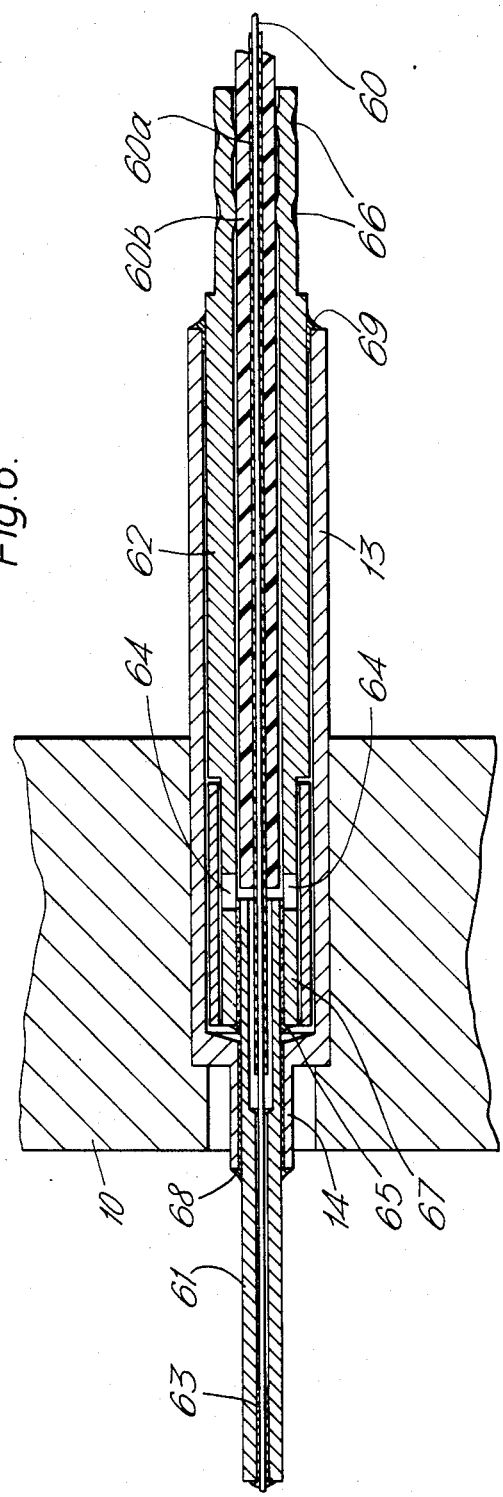
FIG. 6 is a perspective view of the optical fiber tail assembly of the package of FIG. 1.

The optical fiber tail assembly is depicted in FIG. 6. The principal constituents of this assembly are a fiber 60, a fiber support tube 61 and a crimp tube 62, though FIG. 6 shows this assembly fitted inside the feed-through tube 13 in the block 10 of the housing assembly described previously with reference to FIGS. 1 and 2. In this particular instance, the optical fiber 60 is a silica single mode fiber, though for other applications a multimode fiber may be required. The fiber is packaged in primary and secondary plastics coatings 60a and 60b. The primary coating is a thin silicone coating applied on-line with the drawing of the fiber from preform, whereas the secondary coating is a thicker coating applied by extrusion to provide a package about 1 mm in diameter which is reasonably robust for normal handling. The primary and secondary coatings are stripped back from one end of a length of the packaged fiber to expose bare fiber, and the end section 63 of this bare fiber is metallised so that it can be soldered to the support tube 61 to provide a hermetic seal. This metallisation may consist of a number of layers, provided for instance by sputtering, starting with chromium for adhesion to the glass, and finishing with copper covered by a flash of gold for solderability. If the fiber is to have a plane end face produced by cleaving, the metallisation may cover the end of the fiber, in which case the fiber is cleaved at a later stage to prepare a new end face free from metallisation which is subsequently lapped and polished. Generally however, it may be preferred to have a lens-shaped fiber end surface, in which case the lens is typically prepared before metallisation and temporarily masked for the duration of the metallisation process. The fiber is soldered in position in the support tube 61 using a flux-free spherical preform of a gold-tin solder applied to its forward end. The solder does not wet the unmetallised glass of the fiber and hence the fiber end is left free of solder. The support tube, with the fiber already sealed inside, is next inserted into the crimp tube 62. The two tubes are positioned so that the rear end of the support tube is just visible through the holes 64 in the crimp tube, the crimp tube is crimped at 66 to secure it to the secondary coating 60b of the fiber, and then a fillet 65 of resin is applied to the forward end of the crimp tube and allowed to creep back by capillary action to fill the space between the fiber support tube and the crimp tube. A polytetrafluoroethylene sleeve (not shown) is introduced over the fiber support tube as a temporary mask while the assembly is dipped into resin, typically epoxy resin, and vacumm back-filled via the holes 64 to fill all the remaining space inside the crimp tube and the fiber support tube, particularly the space between the bare fiber and the small bore portion of the fiber support tube, in order to serve as a protection for the bare fiber from subsequent attack by water. The filling holes are then covered by a metal sleeve 67.

The other end (not shown) of the packaged fiber 60 may be terminated at this time. Typically the fiber is between 20 and 50 cm long, and the outer end is terminated with a jewelled ferrule termination (not shown) similar to that described in our British Pat. No. 1480445. The primary and secondary coatings are stripped back from the end of the fiber which is then inserted into a metal ferrule which has a pierced bearing watch jewel centred in its forward end. The central aperture of the jewel is a sliding fit over the bare fiber and hence serves to hold the tip of the fiber centred on the ferrule axis, the end of the secondary coating of the fiber is secured within the rear end of the ferrule, and the residual space within the ferrule is filled with resin, typically epoxy resin. Generally the amount of coating stripped from the fiber, and the length of the ferrule, are chosen so that the resin is in contact with the bare fiber for a sufficient distance to ensure reasonably efficient stripping of cladding modes launched into the fiber from the laser. Optionally two lengths (not shown) of heat shrink tubing are slipped over one end of the packaged fiber before the jewelled termination is made so that when it is completed one of the lengths can be shrunk in position over the rear end of the jewelled ferrule and the other over the crimped rear end of the crimp tube.

Figure 7:
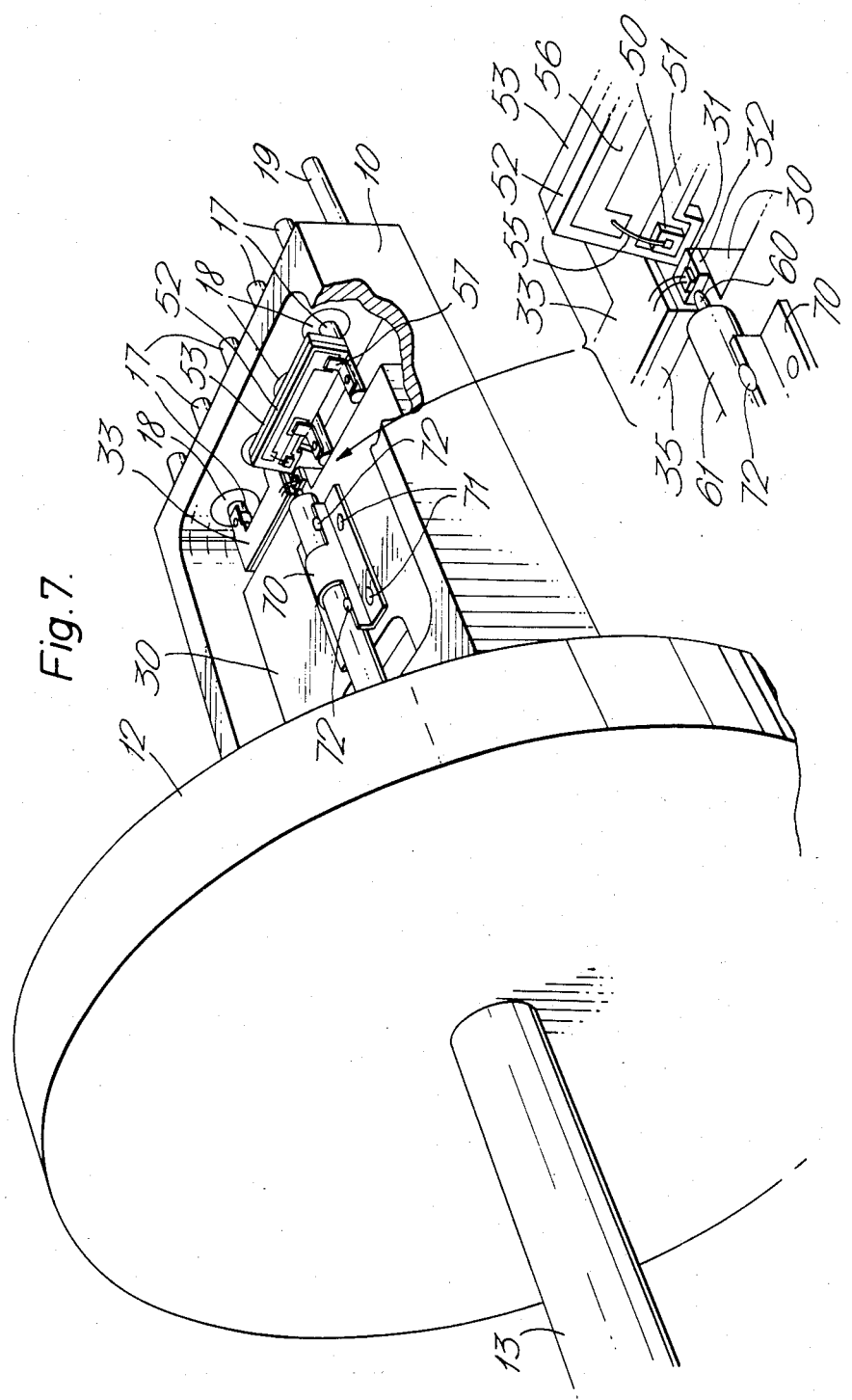
FIG. 7 is a perspective view of the laser package of FIG. 1 after the fitting of the fiber tail laser submount and monitoring photodiode assemblies.
Figure 8:
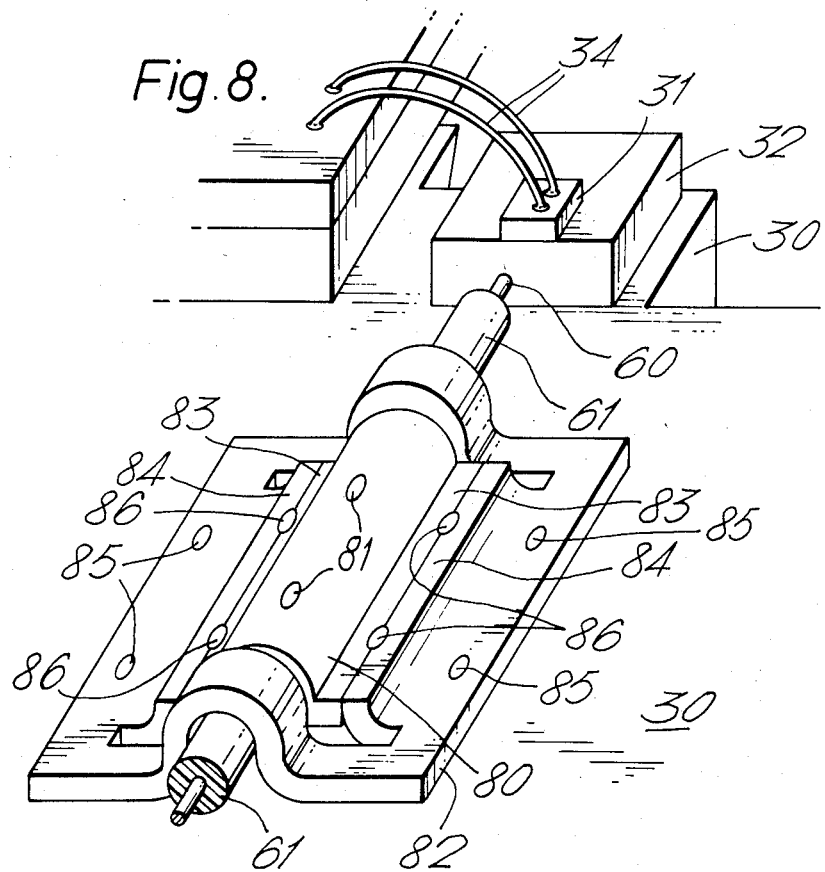
FIG. 8 is a perspective view of part of the laser package of FIG. 1 modified by the incorporation of an alternative form of mounting for the fiber tail assembly.
Figure 9:
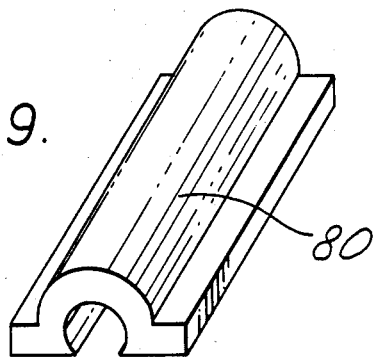
FIG. 9 is a perspective view of one of the component parts of the modified mounting of FIG. 8.

Once the combined laser and photodiode assembly has been soldered in position inside the housing assembly, the fiber support tube 61 of the completed fiber tail assembly is introduced into the bore of the feed-through tube 13 until the forward end is positioned to hold the end of the fiber 60 in the correct position with respect to the laser 31 as depicted in FIG. 7. The fiber support tube is held by a micromanipulator (not shown) gripping it inside the well 11 of the block 10, and its position is adjusted for maximum coupling to the laser output beam. In order to provide a hermetic seal, a fillet 68 (FIG. 6) of tin lead solder is run into the clearance between the exterior of the support tube 61 and the bore of the forward end of the feed-through tube 13 while this positioning is maintained. Still maintaining the positioning of the support tube, a metal anchorage clamp 70 is placed around the support tube and first laser beam welded to the heat sink at two positions 71 on each side of the support tube, and then is laser beam welded to the support tube at two positions 72 on each side. In order to minimise any changes in optical coupling efficiency occasioned by differential thermal expansion effects, it is preferred to make the anchorage clamp of a material whose expansion coefficient matches that of the pedestal 32, and to arrange for the laser beam welds 72 to be level with the top of the pedestal and hence diametrically disposed about the support tube surface. Then the micro-manipulator is removed, the lid 15 (FIG. 1) fitted to the block 10 and projection welded to form a hermetic seal. Optionally a resin, fillet 69 (FIG. 6) such as a cyanoacrylate, is applied to the rear end of the feed-through tube sealing the gap between it and the crimp tube 62.

If desired the sequence of welding the anchorage clamp to the heat sink before welding it to the fiber support tube may be reversed. It is also possible to apply the solder fillet 68 after the laser beam welding of the anchorage clamp, but performing the soldering first reduces the risk of misalignment resulting from thermally induced strain incurred during the soldering heating cycle. In this context it may be noted that the amount of heating is minimised by the choice of a low temperature solder, and by designing the block 10 so that there is a clearance around the forward end 14 of the feed-through tube.

In some circumstances the rapid and highly localised thermal cycling produced by making the welds 72 can cause a slight distortion of the support tube 61 as the weld pools cool. Misalignment resulting from this cause can be avoided, or at least reduced in magnitude, by adopting the construction depicted in FIG. 8. This construction has a slightly different form of anchorage clamp, and employs an intermediate member 80 separately illustrated in FIG. 9. This intermediate member is made of metal and is secured to the fiber support tube 61 by laser beam welds 81 before the resulting assembly is welded to the anchorage clamp 82. The metal of which it is made may be the same as that of the support tube, or as that of the anchorage clamp expansion matched with the material of the laser pedestal 32. Flanges 83 on the intermediate member 80 butt against corresponding flanges 84 on the anchorage clamp 82, and, after making the welds 81, the clamp 82 is laser beam welded at points 85 to the heat sink and at points 86 to the intermediate member. Any misalignment resulting from distortion of the fiber support tube produced by making the welds 81 can be compensated before making the welds 85 and 86. The making of the welds 86 does not introduce the same risk of distortion of the fiber support tube as the making of the welds 72 because of the additional rigidity provided by the intermediate member 80.

Preferably the design of the flanges 84 of the anchorage clamp should be such as to make them lightly sprung against the corresponding flanges 83 so that there is no gap between them in the neighbourhood of the welds.

For submarine use the maximum service temperature is generally low enough to make it unnecessary to make any provision for thermo-electric heat pump assisted cooling. For other applications that do require the use of such assisted cooling, the heat pump may be arranged external to the package so as to remove heat from the wall of the package, or it may be arranged inside the package so as to remove heat from the laser heat sink internal to the package and duct it towards a further heat sink external to the package. The laser package of FIGS. 1 to 9 can be used without modification in an application requiring the use of an external heat pump, while the laser package of FIGS. 10 and 11 shows one way by which the laser package of FIGS. 1 to 9 can be adapted to incorporate an internal heat pump.

Figure 10:
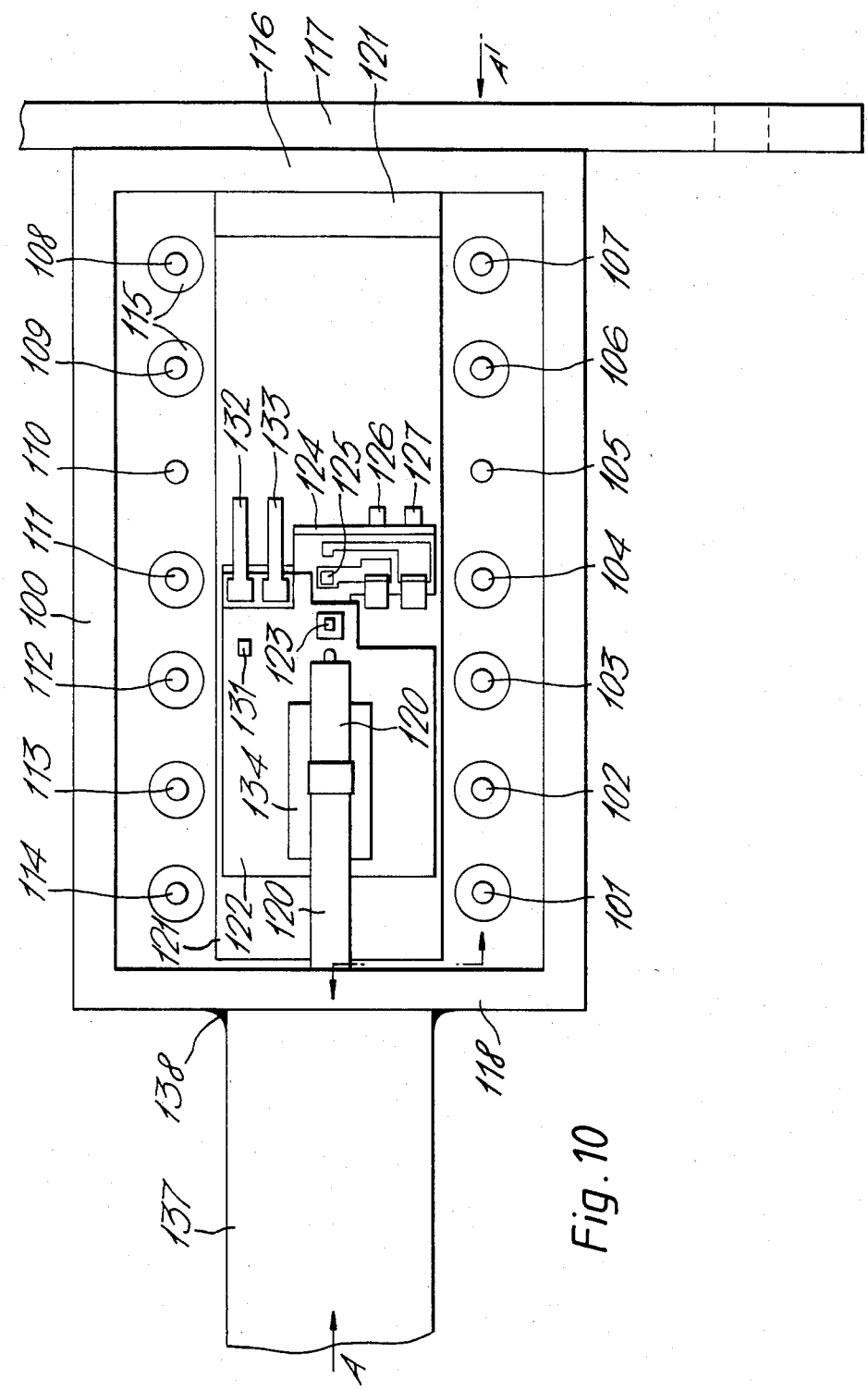
FIG. 10 is a plan view of an alternative laser package which incorporates a thermoelectric heat pump.
Figure 11:
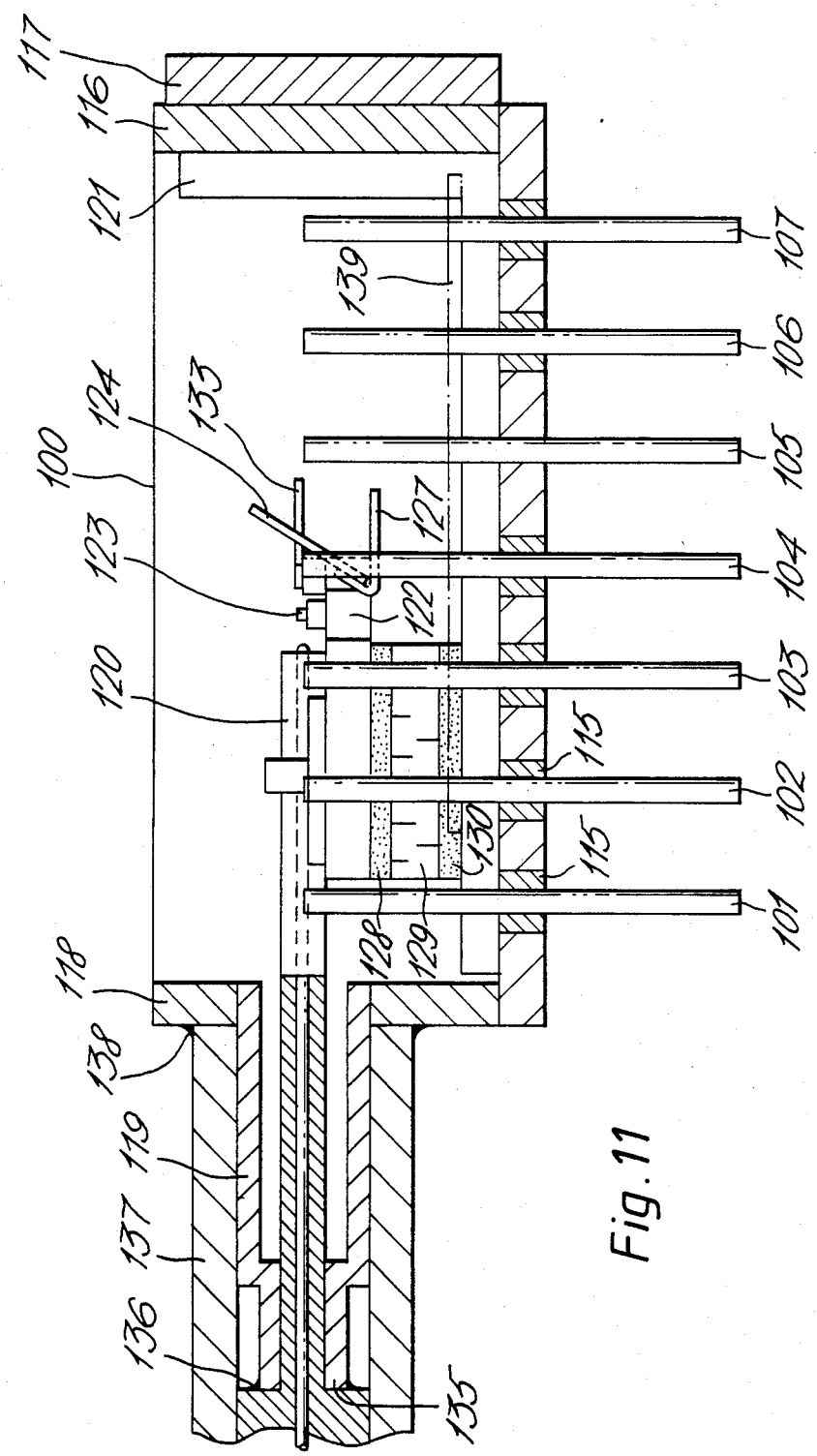
FIG. 11 is a sectional view of the package of FIG. 10 sectioned along the line A–A$^1$.

Referring to FIGS. 10 and 11, the basic design of housing assembly has a number of design differences from that of the previous device. In particular, the main body of the housing is provided by a can 100 with 14 terminal pins 101 to 114 arranged in dual-in-line array. The two pins 105 and 110 are directly connected with the base of can, while the remainder are insulated from the base by glass-to-metal seals 115. One end 116 of the can is provided with flanges 117 for clamping this end to an external heat sink (not shown). At the other end 118 of the can there is an externally protruding tube 119 into which a fiber tail assembly 120 is sealed. This fiber tail assembly is of essentially the same general construction as that of the corresponding assembly described above with particular reference to FIG. 6. The material from which the can 100 is made is a relatively poor conductor of heat and so the interior of the can is clad with a copper strip 121 extending along the base between the pins and up the end wall 116 with the heat sink clamping flanges 117.

Inside the can there is a laser submount assembly 122 with laser 123 to which is secured a monitor photodiode assembly 124 with photodiode 125. The general construction of the combined laser and photodiode assembly 122, 124 is basically the same as the corresponding assembly described above with particular reference to FIGS. 3, 4 and 5.

The photodiode assembly 124 has a cranked submount secured to an inclined rear face of the heat sink of the laser assembly so that the normal to the face of the photodiode 125 is inclined at an angle to the axis of the laser 123. Terminal connection with the printed ceramic circuit upon which the photodiode is mounted is made by way of tags 126 and 127 which are bent under the cranked submount. These tags 126, 127 are connected by flying leads (not shown) respectively to terminal pins 117 and 118.

The heat sink of the laser assembly of FIGS. 3 and 4 is made of copper, but that of this laser assembly 122 is made of a two-phase copper tungsten material sold under the trade mark ELKONITE because this material has a lower coefficient of thermal expansion than copper and is better suited for soldering to the upper ceramic layer 128 (cold junction side) of a Peltier effect thermo-electric heat pump 129, whose lower ceramic layer 130 (hot junction side) is soldered to the copper cladding 121. The lower expansion of the tungsten copper material also means that the use of a separate diamond pedestal can be dispensed with, and instead the laser can be mounted on a pedestal formed integrally with the heat sink. The temperature of the heat sink is monitored using a thermistor 131 mounted on the heat sink. One terminal connection with this thermistor is made by way of the heat sink, while the other is made by way of a tag 132 and terminal pin 111. Similarly one terminal connection for the laser 123 is also made by way of the heat sink, while the other is made by way of a tag 133 and terminal pin 109. Connections between the thermistor and the laser and their respective tags, and between these tags and their respective terminal pins are made by way of flying leads (not shown). Similarly flying leads (not shown) are employed for making terminal connection between the thermo-electric cooler 129 and its terminal pins 101 and 114.

The fiber tail assembly 120 is secured by laser beam welding to the heat sink of the laser assembly 122 using an anchorage clamp 134. This anchorage clamp may have the same general configuration as that of the anchorage clamp 70 described above with particular reference to FIG. 7 or as that of the clamp described above with reference to FIGS. 8 and 9. The manner by which the fiber tail assembly is sealed through the wall of the package has a number of differences from that of the package of FIGS. 1 to 9 which provide a longer unsupported region of the fiber tail assembly within the package and hence a lower thermal conductance path for the leakage of heat from the walls of the package back into the laser assembly heat sink 122 by way of this fiber tail assembly. A forward facing shoulder 135 of the fiber tail assembly butts against the rear end of the tube 119, and a seal is effected with a solder fillet 136. The tube 119 is made of a material chosen to provide a measure of compensation for the differential expansion effects resulting from the use of the different materials for the heat sink and for the fiber tail assembly. When using a fiber tail assembly whose forward end is made of nickel, a suitable material from which to construct the tube 119 is brass. Further mechanical protection for this joint is provided by a cover tube 137 slipped over the assembly and cemented in position at 138. The fiber tail assembly also functions to provide the necessary electrical connection between the laser assembly heat sink and terminal pins 105 and 110. If in certain applications this electrical path is not adequate for the laser and the thermistor connections, it may be supplemented by an additional flying lead connection (not shown) direct from the heat sink to one or other of the two terminal pins.

Optionally the electrical connections between the terminal pins and the tags 126, 127, 132 and 133 can be made by way of conductive tracks on a hybrid ceramic substrate 139. This may be of generally U-shaped configuration, which is soldered to the terminal pins and has a substantially rectangular region between pins 105 to 110 and a pair of limbs extending either side of the thermo-electric cooler to the other terminal pins. This hybrid ceramic substrate may also carry active elements forming part of circuitry for driving the laser and/or the monitor photodiode. In certain circumstances this circuitry may be sufficiently complex to warrant the use of a longer can providing the facility for additional terminal pin connections, in which case a 20 pin can may be substituted for the 14 pin can shown in the drawings. Connections between the tracks on the hybrid ceramic substrate and tags 126, 127, 132 and 133 are preferably by means of fine wires acting as thermal breaks to minimise the conduction of heat for the hybrid to the laser assembly.

The laser package is completed by fitting a lid (not shown) to the package and hermetically sealing this lid to the top of the walls of the can 100.

We claim:

1. A hermetically sealed injection laser package comprising:
    a metal housing including a wall with an aperture therethrough;
    a metal heat sink secured inside said package housing on which the injection laser is mounted;
    a feed-through tube mounted in said aperture and having one end portion which extends outside of said housing and a second end portion which extends inside of said housing;
    a metal support tube having one end secured in said second end portion of said feed through tube and a second end which extends adjacent the injection laser;
    an optical fiber extending through said support tube and said feed through tube and being hermetically sealed to said support tube with a hermetic glass-to-metal joint; and
    anchor means secured to said tube and to said heat sink by welding to provide coupling of the laser output with said optical fiber.

2. The laser package of claim 1 further comprising a thermo-electric heat pump having a cold junction side and a hot junction side and being mounted on said heat sink on the cold junction side and a high thermal conductivity means mounted on the hot junction side for ducting extracted heat to an external surface of the package for transfer out of the package.

3. The laser package as claimed in claim 2, wherein said thermo-electric heat pump is secured to said heat sink and to said high thermal conductivity means by solder.

4. The laser package as claimed in claim 3, wherein the heat sink is made of a two phase tungsten copper material.

5. The laser package as claimed in claim 1, wherein the optical fiber is a single mode fiber.

6. The laser package as claimed in claim 1 further comprising a pedestal mounted between the laser and said heat sink and wherein the anchor means is made of a low expansion metal having a coefficient of thermal expansion matched with that of said pedestal.

7. The laser package as claimed in claim 1 further comprising a photodiode for monitoring the output of the laser secured inside said housing to said laser heat sink.

8. The laser package as claimed in claim 7, further comprising a hybrid ceramic substrate located in said housing and electronic components mounted on said substrate and forming part of circuitry for driving at least one of the laser and said photodiode.

9. The laser package as claimed in claim 7 wherein said photodiode is secured to said heat sink so that light incident upon the photodiode from the laser and reflected by the photodiode is reflected in a direction away from the laser optic axis.

10. The laser package as claimed in claim 1 further comprising a substantially V-shaped member secured on the outer surface of said support tube, said member and said support tube being secured to said anchor means.

* * * * *